(12) United States Patent
Luo et al.

(10) Patent No.: US 11,817,460 B2
(45) Date of Patent: Nov. 14, 2023

(54) THIN FILM TRANSISTOR AND METHOD FOR MANUFACTURING THE SAME, ARRAY SUBSTRATE, AND DISPLAY DEVICE

(71) Applicant: BOE TECHNOLOGY GROUP CO., LTD., Beijing (CN)

(72) Inventors: Chao Luo, Beijing (CN); Feng Guan, Beijing (CN); Zhi Wang, Beijing (CN); Jianhua Du, Beijing (CN); Yang Lv, Beijing (CN); Zhaohui Qiang, Beijing (CN); Chao Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 73 days.

(21) Appl. No.: 17/263,748

(22) PCT Filed: Mar. 27, 2020

(86) PCT No.: PCT/CN2020/081781
§ 371 (c)(1),
(2) Date: Jan. 27, 2021

(87) PCT Pub. No.: WO2021/189445
PCT Pub. Date: Sep. 30, 2021

(65) Prior Publication Data
US 2022/0115413 A1    Apr. 14, 2022

(51) Int. Cl.
*H01L 27/12* (2006.01)
*H01L 29/66* (2006.01)
*H01L 29/786* (2006.01)

(52) U.S. Cl.
CPC ...... *H01L 27/1237* (2013.01); *H01L 27/1222* (2013.01); *H01L 27/1285* (2013.01);
(Continued)

(58) Field of Classification Search
CPC ............ H01L 27/1222; H01L 27/1237; H01L 27/1285; H01L 29/66477; H01L 29/66765; H01L 29/78669; H01L 29/78678
See application file for complete search history.

(56) References Cited

U.S. PATENT DOCUMENTS

| 5,047,360 A | * | 9/1991 | Nicholas | ........... H01L 29/78669 |
|---|---|---|---|---|
| | | | | 257/E21.414 |
| 6,359,320 B1 | * | 3/2002 | Yamazaki | ......... H01L 29/78627 |
| | | | | 257/E21.414 |

(Continued)

FOREIGN PATENT DOCUMENTS

| CN | 105789327 | * | 7/2016 |
| CN | 109300991 | * | 2/2019 |
| CN | 110137261 | * | 8/2019 |

OTHER PUBLICATIONS

International Search Report for corresponding PCT Application No. PCT/CN2020/081781, 8 pages.
(Continued)

*Primary Examiner* — Ahmed N Sefer
(74) *Attorney, Agent, or Firm* — Dority & Manning, PA

(57) ABSTRACT

A thin film transistor includes a gate, a gate insulating layer, an active layer, an ionized amorphous silicon layer, a source and a drain. The gate insulating layer covers the gate. The active layer is disposed on a side of the gate insulating layer away from the gate. The ionized amorphous silicon layer is disposed on a side of the active layer away from the gate, and the ionized amorphous silicon layer is in contact with the gate insulating layer. The source and the drain are disposed on a side of the ionized amorphous silicon layer away from the gate insulating layer, and the source and the drain are coupled to the active layer through the ionized amorphous silicon layer.

14 Claims, 11 Drawing Sheets

(52) U.S. Cl.
CPC .. *H01L 29/66477* (2013.01); *H01L 29/66765* (2013.01); *H01L 29/78669* (2013.01); *H01L 29/78678* (2013.01)

(56) References Cited

U.S. PATENT DOCUMENTS

| | | | | |
|---|---|---|---|---|
| 2001/0049163 | A1* | 12/2001 | Yamazaki | H01L 29/66765 257/E21.414 |
| 2008/0001150 | A1* | 1/2008 | Chae | H01L 29/4908 257/E21.414 |
| 2008/0001151 | A1* | 1/2008 | Jun | H01L 29/458 257/E21.414 |
| 2010/0136755 | A1* | 6/2010 | Gi Jun | H01L 29/4908 257/E21.414 |
| 2016/0254285 | A1* | 9/2016 | Long | H01L 29/78618 257/72 |
| 2016/0260837 | A1 | 9/2016 | Koczuka et al. | |
| 2016/0380113 | A1* | 12/2016 | Kang | H01L 27/1222 349/139 |
| 2017/0077310 | A1 | 3/2017 | Oda et al. | |
| 2017/0154773 | A1* | 6/2017 | Zhou | H01L 29/78678 |
| 2017/0162709 | A1 | 6/2017 | Nodera et al. | |
| 2018/0122839 | A1* | 5/2018 | Nodera | H01L 21/02678 |
| 2018/0212065 | A1 | 7/2018 | Matsushima et al. | |
| 2019/0035629 | A1* | 1/2019 | Mizumura | H01L 21/02678 |
| 2019/0074384 | A1* | 3/2019 | Mizumura | H01L 29/78621 |
| 2019/0172932 | A1* | 6/2019 | Qian | H01L 29/78678 |
| 2019/0348538 | A1* | 11/2019 | Koezuka | H01L 21/02565 |
| 2021/0159344 | A1* | 5/2021 | Ohta | H01L 29/1041 |
| 2021/0217899 | A1* | 7/2021 | Cheng | H01L 29/78672 |
| 2021/0226065 | A1* | 7/2021 | Cao | H01L 29/7869 |
| 2021/0327914 | A1* | 10/2021 | Mo | H01L 29/42364 |
| 2021/0343878 | A1* | 11/2021 | Ohta | H01L 21/823418 |

OTHER PUBLICATIONS

Chinese First Office Action (w/ English translation) for corresponding CN Application No. 202080000424.1. dated Jul. 5, 2022—20 pages.

* cited by examiner

TFT

A-A'

(a)

(b)

THIN FILM TRANSISTOR AND METHOD FOR MANUFACTURING THE SAME, ARRAY SUBSTRATE, AND DISPLAY DEVICE

CROSS-REFERENCE TO RELATED APPLICATION

This application is a national phase entry under 35 USC 371 of International Patent Application No. PCT/CN2020/081781 filed on Mar. 27, 2020, which is incorporated herein by reference in its entirety.

TECHNICAL FIELD

The present disclosure relates to the field of display technologies, and in particular, to a thin film transistor and a method for manufacturing the same, an array substrate, and a display device.

BACKGROUND

With characteristics of small size, low power consumption and no radiation, thin film transistors (TFTs) are currently the main switching elements in display devices.

SUMMARY

In an aspect, a thin film transistor (TFT) is provided. The TFT includes a gate, a gate insulating layer, an active layer, an ionized amorphous silicon layer, a source and a drain. The gate insulating layer covers the gate. The active layer is disposed on a side of the gate insulating layer away from the gate. The ionized amorphous silicon layer is disposed on a side of the active layer away from the gate, and the ionized amorphous silicon layer is in contact with the gate insulating layer. The source and the drain are disposed on a side of the ionized amorphous silicon layer away from the gate insulating layer, and the source and the drain are coupled to the active layer through the ionized amorphous silicon layer.

In some embodiments, a density of the gate insulating layer is less than a density of the active layer.

In some embodiments, a material of the gate insulating layer includes silicon oxide.

In some embodiments, the gate insulating layer includes a first gate insulating sub-layer and a second gate insulating sub-layer that are stacked. A material of the first gate insulating sub-layer includes silicon dioxide, and a material of the second gate insulating sub-layer includes silicon nitride. The first gate insulating sub-layer is closer to the ionized amorphous silicon layer than the second gate insulating sub-layer.

In some embodiments, a thickness of the first gate insulating sub-layer is within a range of 1000 Å to 2000 Å, and a thickness of the second gate insulating sub-layer is within a range of 2500 Å to 3500 Å.

In some embodiments, the active layer includes a polysilicon pattern and an amorphous silicon pattern. The amorphous silicon pattern is disposed on at least one side of the polysilicon pattern, and at least one of the source and the drain is coupled to the amorphous silicon pattern.

In some embodiments, the amorphous silicon pattern surrounds the polysilicon pattern in directions parallel to a surface of the gate away from the gate insulating layer, and the source and the drain are coupled to the amorphous silicon pattern.

In some embodiments, width of portions of the amorphous silicon pattern located on two opposite sides of the polysilicon pattern are equal.

In some embodiments, in a direction parallel to the surface of the gate away from the gate insulating layer and to a connection line between the source and the drain, a width of a portion of the amorphous silicon pattern on a side of the polysilicon pattern is within a range of 2 μm to 5 μm.

In some embodiments, the TFT further includes a barrier layer. The barrier layer is disposed on the side of the active layer away from the gate, and an edge of the ionized amorphous silicon layer proximate to the active layer overlaps on a surface of the barrier layer away from the gate.

In some embodiments, the active layer includes a polysilicon pattern and an amorphous silicon pattern, an orthographic projection of the polysilicon pattern on a surface of the gate away from the gate insulating layer is within a range of an orthographic projection of a barrier layer on the surface of the gate away from the gate insulating layer, and an edge of the orthographic projection of the barrier layer on the surface of the gate away from the gate insulating layer coincides with an edge of an orthographic projection of the active layer on the surface of the gate away from the gate insulating layer.

In some embodiments, a thickness of the barrier layer is within a range of 1000 Å to 1500 Å.

In some embodiments, the ionized amorphous silicon layer includes an ion doped sub-layer and an amorphous silicon sub-layer. The on doped sub-layer is farther away from the gate than the amorphous silicon sub-layer.

In some embodiments, a thickness of the amorphous silicon sub-layer is within a range of 500 Å to 1000 Å, and a thickness of the ion doped sub-layer is within a range of 500 Å to 1000 Å.

In another aspect, an array substrate is provided. The array substrate includes the TFT according to any of the above embodiments.

In yet another aspect, a display device is provided. The display device includes the array substrate according to the above embodiment.

In yet another aspect, a method for manufacturing a TFT is provided. The method includes: forming a gate of a TFT on a substrate;

forming a gate insulating layer covering the gate on a side of the gate away from the substrate; forming an active layer on a side of the gate insulating layer away from the gate;

forming an ionized amorphous silicon layer on a side of the active layer away from the gate insulating layer, the ionized amorphous silicon layer being in contact with the gate insulating layer; and forming a source and a drain on a side of the ionized amorphous silicon layer away from the gate insulating layer, the source and the drain being coupled to the active layer through the ionized amorphous silicon layer.

In some embodiments, forming the active layer includes: depositing an amorphous silicon material on the side of the gate insulating layer away from the gate to form a first amorphous silicon film; using a partial laser annealing process to crystallize the first amorphous silicon film to form a polysilicon pattern; depositing a material for forming a barrier layer on the crystallized first amorphous silicon film to form a barrier film; using a first mask to pattern the barrier film and the crystallized first amorphous silicon film; and removing portions of the barrier film and the crystallized first amorphous silicon film other than regions thereof to be formed into the active layer to form the barrier layer and an amorphous silicon pattern, so as to obtain the active layer including the polysilicon pattern and the amorphous silicon pattern.

In some embodiments, forming the gate insulating layer, the ionized amorphous silicon layer, the source and the drain includes: depositing a silicon nitride material on a side of the gate away from the substrate to form a second gate insulating sub-layer; depositing a silicon dioxide material on a side of the second gate insulating sub-layer away from the substrate to form a first gate insulating sub-layer, so as to obtain the gate insulating layer including the first gate insulating sub-layer and the second gate insulating sub-layer; after the active layer is formed, depositing an amorphous silicon material on the side of the active layer away from the gate by a vapor deposition process to form a second amorphous silicon film, the second amorphous silicon film being in contact with the first gate insulating sub-layer; performing ion doping on a side of the second amorphous silicon film away from the first gate insulating sub-layer; depositing a material for forming the source and the drain on the side of the second amorphous silicon film after ion doping away from the first gate insulating sub-layer to form a conductive film; and using a second mask to pattern the conductive film and the second amorphous silicon film after ion doping to form the source, the drain and the ionized amorphous silicon layer.

BRIEF DESCRIPTION OF THE DRAWINGS

In order to describe technical solutions in the present disclosure more clearly, accompanying drawings to be used in some embodiments of the present disclosure will be introduced briefly. Obviously, the accompanying drawings to be described below are merely accompanying drawings of some embodiments of the present disclosure, and a person of ordinary skill in the art can obtain other drawings according to these drawings. In addition, the accompanying drawings to be described below may be regarded as schematic diagrams, and are not limitations on actual sizes of products, actual processes of methods and actual timings of signals involved in the embodiments of the present disclosure.

DETAILED DESCRIPTION

Figure 1:
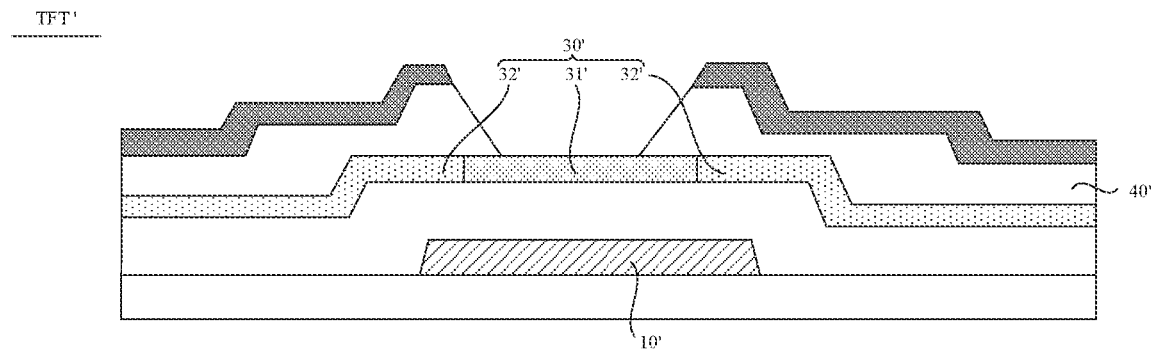
FIG. 1 is a structural diagram of a thin film transistor (TFT), according to the related art.

Technical solutions in some embodiments of the present disclosure will be described below clearly and completely in combination with accompanying drawings. Obviously, the described embodiments are merely some but not all embodiments of the present disclosure. All other embodiments obtained on a basis of the embodiments of the present disclosure by a person of ordinary skill in the art shad be included in the protection scope of the present disclosure.

Unless the context requires otherwise, throughout the description and claims, the term "comprise" and other forms thereof such as the third-person singular form "comprises" and the present participle form "comprising" are construed as open and inclusive, i.e., "including, but not limited to". In the description of the specification, terms such as "one embodiment", "some embodiments", "exemplary embodiments", "example", "specific example", or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, specific features, structures, materials or characteristics may be included in any one or more embodiments or examples in any suitable manner.

Hereinafter, the terms such as "first" and "second" are used for descriptive purposes only, and are not to be construed as indicating or implying the relative importance or implicitly indicating the number of indicated technical features. Thus, features defined as "first" and "second" may explicitly or implicitly include one or more of the features. In the description of the embodiments of the present disclosure, the terms "a plurality of" and "the plurality of" mean two or more unless otherwise specified.

In the description of some embodiments, the expressions "coupled" and "connected" and their extensions may be used. For example, the term "connected" may be used in the description of some embodiments to indicate that two or more elements are in direct physical contact or electrical contact with each other. For another example, the term "coupled" may be used in the description of some embodiments to indicate that two or more components are in direct physical or electrical contact. However, terms such as "coupled" or "communicatively coupled" may also mean that two or more components are not in direct contact with each other, but yet still cooperate or interact with each other. The embodiments disclosed herein are not necessarily limited to the content herein.

"At least one of A, B, and C" has a same meaning as "at least one of A, B, or C", and both include the following combinations of A, B, and C: only A, only B, only C, a combination of A and B, a combination of A and C, a combination of B and C, and a combination of A, B, and C.

As used herein, "about" or "approximately" includes the stated value and the average value within an acceptable deviation range of a specific value. The acceptable deviation range is determined by those skilled in the art in consideration of the measurement in question and errors associated with the measurement of a specific quantity (i.e., limitations of a measurement system).

Exemplary embodiments are described herein with reference to sectional views and/or plan views as idealized exemplary drawings. In the accompanying drawings, thicknesses of layers and regions are exaggerated for clarity. Thus, variations in shape with respect to the accompanying drawings due to, for example, manufacturing techniques and/or tolerances can be conceivable. Therefore, the exemplary embodiments should not be construed as being limited to the shapes of regions shown herein, but include deviations in shape due to, for example, manufacturing. For example, an etched region shown as a rectangle will generally have the feature of being curved. Therefore, regions shown in the accompanying drawings are schematic in nature, and their shapes are not intended to show actual shapes of the regions in a device and are not intended to limit the scope of the exemplary embodiments.

In the related art, during a process of manufacturing a low temperature polysilicon thin film transistor (LTPS-TFT), an excimer laser anneal (ELA) process is adopted to transform amorphous silicon (a-Si) into polysilicon (p-Si), so as to obtain a polysilicon active layer. Electron mobility of the LTPS-TFT is approximately 100 cm$^2$/(V·s). Due to a limitation of a length of laser beam in the ELA process, laser spots will overlap during laser scanning, which affects uniformity of annealing and makes it difficult to produce large-size display devices. Furthermore, in order to reduce a leakage current of the LTPS-TFT in an off-state and fabricate TFTs with high-mobility, processes such as ion implantation and activation may be performed on polysilicon patterns in the LTPS-TFTs. For example, a lightly doped drain (LDD) may be obtained for top-gate TFTs. However, the process is difficult, and it is difficult to apply it to the production of large-size display devices.

In addition, in a case where oxide materials (such as IGZO) are used to fabricate the active layers of TFTs with high mobility, due to a relatively low stability of oxides, it is difficult to guarantee a reliability of the TFTs. Therefore, oxides are seldom used to produce large-size display devices.

Based on this, a partial laser anneal (PLA) process is adopted to transform an amorphous silicon material into a polysilicon material, which may reduce the process difficulty and cost, and is suitable for production of large-size display devices. As shown in FIG. 1, the active layer 30' in the TFT' includes a polysilicon pattern 31' and an amorphous silicon pattern 32'. A material for forming an ionized amorphous silicon layer 40' is deposited on the active layer 30' to form the ionized amorphous silicon layer 40'. The ionized amorphous silicon layer 40' is in contact with the amorphous silicon pattern 32' in the active layer 30'. A gas (such as hydrogen (H2)) is produced during the deposition of the material for forming the ionized amorphous silicon layer 40', and diffuses from a surface of the active layer 30' away from the gate 10' to a plane where the TFT' is located. Due to a high density of amorphous silicon, the diffusion of the gas is hindered, and bubbling is likely to occur at a contact surface between the ionized amorphous silicon layer 40' and the amorphous silicon pattern 32' in the active layer 30'. As a result, an adhesion of the contact surface between the ionized amorphous silicon layer 40' and the amorphous silicon pattern 32' is poor, so that films in the TFT' are easy to fall off in subsequent processes (such as high temperature processes).

Figure 2:
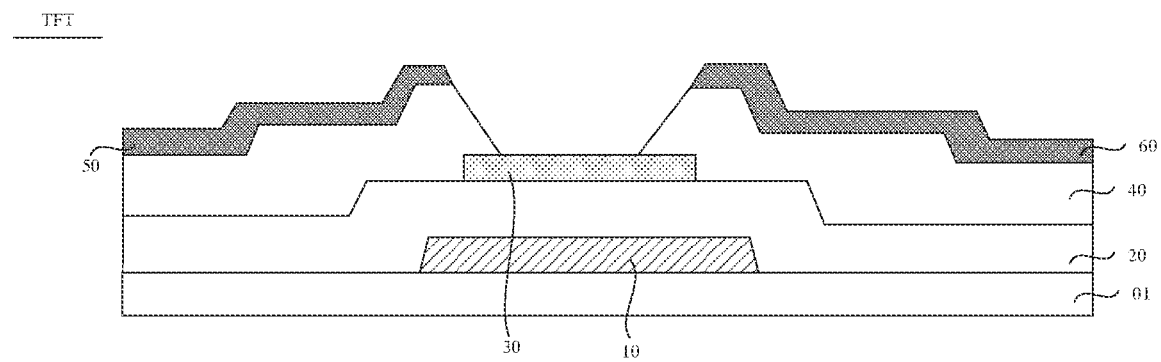
FIG. 2 is a structural diagram of a TFT, according to some embodiments of the present disclosure.

Embodiments of the present disclosure provide a thin film transistor (TFT). As shown in FIG. 2, the TFT includes a gate 10, a gate insulating layer 20, an active layer 30, an ionized amorphous silicon layer 40, a source 50 and a drain 60.

It will be noted that, as shown in FIG. 2, the TFT is disposed on a substrate 01. For example, the substrate 01 may be a glass substrate.

The gate insulating layer 20 covers the gate 10.

The active layer 30 is disposed on a side of the gate insulating layer 20 away from the gate 10.

The ionized amorphous silicon layer 40 is disposed on a side of the active layer 30 away from the gate 10, and the ionized amorphous silicon layer 40 is in contact with the gate insulating layer 20.

The source 50 and the drain 60 are disposed on a side of the ionized amorphous silicon layer 40 away from the gate insulating layer 20, and the source 50 and the drain 60 are coupled to the active layer 30 through the ionized amorphous silicon layer 40.

It can be understood that, a material of the ionized amorphous silicon layer 40 includes an amorphous silicon material.

A material of the active layer 30 includes an amorphous silicon material. A material of the source 50 and the drain 60 includes a metallic material, such as molybdenum (Mo), copper (Cu), or aluminum (Al).

For example, a density of the gate insulating layer 20 is less than a density of the active layer 30.

In the process of forming the TFT, when the material for forming the ionized amorphous silicon layer 40 is being deposited on a surface of the active layer 30 away from the gate 10, the gas associated with the deposition process may diffuse to the gate insulating layer 20. Since the density of the gate insulating layer 20 is less than the density of the active layer 30, a barrier effect of the gate insulating layer 20 on gas diffusion is less than that of the active layer 30. As a result, the gas diffuses faster in the gate insulating layer 20. Therefore, it may be possible to avoid bubbling in a surface of the ionized amorphous silicon layer 40 proximate to the gate insulating layer 20, and avoid falling off of films in the TFT in subsequent fabrication processes.

Furthermore, since a contact resistance is very high in a case where the source 50 and the drain 60 are in direct contact with the active layer 30, it may be possible to reduce the contact resistance between the active layer 30 and both the source 50 and the drain 60 by using the ionized amorphous silicon layer 40 to couple the source 50 and the drain 60 to the active layer 30, and thus may improve a signal transmission efficiency between the active layer 30 and both the source 50 and the drain 60.

Therefore, in the TFT provided in the embodiments of the present disclosure, the ionized amorphous silicon layer 40 is in contact with the gate insulating layer 20. When the material for forming the ionized amorphous silicon layer 40 is deposited on the surface of the active layer 30 away from the gate 10, the gas associated with the deposition process may diffuse to the gate insulating layer 20. Since the density of the gate insulating layer 20 is less than the density of the active layer 30, the barrier effect of the gate insulating layer 20 on gas diffusion is less than that of the active layer 30. As a result, the gas diffuses faster in gate insulating layer 20.

Therefore, it may avoid bubbling in the surface of the ionized amorphous silicon layer 40 proximate to the gate insulating layer 20, and avoid falling off of the films in the TFT in the subsequent fabrication processes. In this way, it may be possible to improve a stability and yield of the TFT, so that TFTs can be applied to large-size display devices.

In some embodiments, a material of the gate insulating layer 20 includes silicon oxide (SiOx).

For example, the material of the gate insulating layer 20 may be silicon dioxide (SiO2).

In this case, the gate insulating layer 20 may improve an adhesion of a contact surface between the ionized amorphous silicon layer 40 and the gate insulating layer 20.

Figure 3:
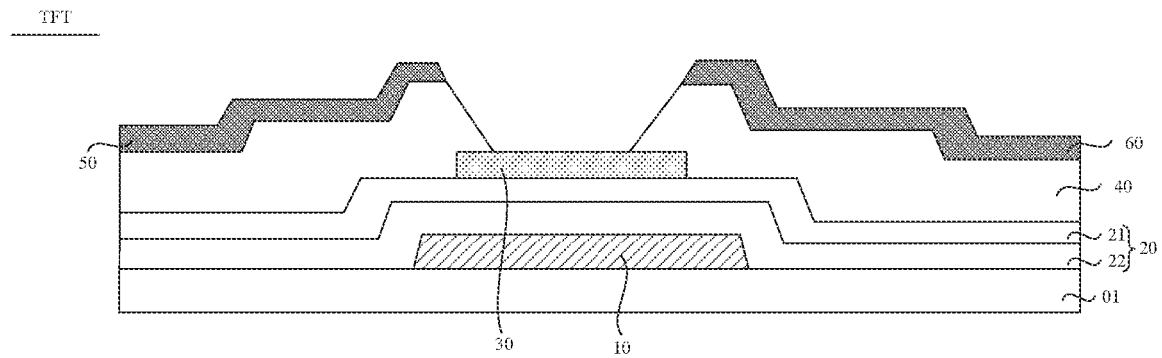
FIG. 3 is a structural diagram of another TFT, according to some embodiments of the present disclosure.

In some embodiments, as shown in FIG. 3, the gate insulating layer 20 includes a first gate insulating sub-layer 21 and a second gate insulating sub-layer 22 that are stacked. The first gate insulating sub-layer 21 is closer to the ionized amorphous silicon layer 40 than the second gate insulating sub-layer 22.

A material of the first gate insulating sub-layer 21 includes silicon dioxide (SiO2), and a material of the second gate insulating sub-layer 22 includes silicon nitride (SixNy).

In this case, the second insulating sub-layer 22 may prevent impurities from entering the active layer 30 from the side of the second insulating sub-layer 22 away from the active layer 30. For example, in the process of forming a TFT on the glass substrate, the second gate insulating sub-layer 22 may prevent impurities in the glass substrate from entering the active layer 30. The first gate insulating sub-layer 21 may improve the adhesion of the contact surface between itself and the ionized amorphous silicon layer 40 and improve the contact effect.

In some embodiments, a thickness of the first gate insulating sub-layer is within a range of 1000 Å to 2000 Å, and a thickness of the second gate insulating sub-layer is within a range of 2500 Å to 3500 Å.

Figure 4:
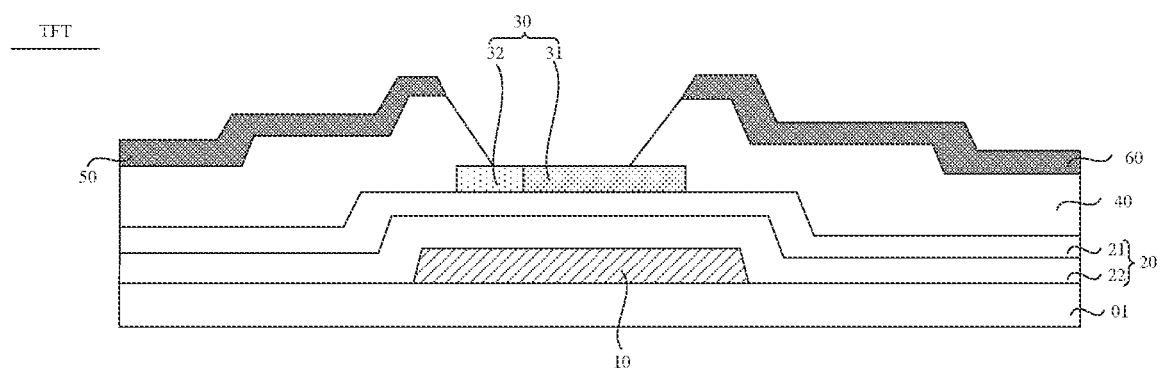
FIG. 4 is a structural diagram of yet another TFT, according to some embodiments of the present disclosure.

In some embodiments, as shown in FIG. 4, the active layer 30 includes a polysilicon pattern 31 and an amorphous silicon pattern 32 located on at least one side of the polysilicon pattern 31.

At least one of the source 50 and the drain 60 is coupled to the amorphous silicon pattern 32.

In this case, during signal transmission between the source 50 and the drain 60, carriers will pass through the amorphous silicon pattern 32 and the polysilicon pattern 31 in the active layer 30, which is equivalent to that the polysilicon pattern 31 and the amorphous silicon pattern 32 are connected in series in a channel region of the TFT.

However, in the TFT' shown in FIG. 1, a channel region of the TFT' only includes the polysilicon patterns 31', and carriers only pass through the polysilicon pattern 31' when being transmitted in the channel region, Therefore, the carrier mobility of the polysilicon material is high, which leads to a high leakage current in the off-state, Compared to the related art, in the TFT provided in the embodiments of the present disclosure, since the carriers pass through the polysilicon pattern 31 and the amorphous silicon pattern 32 when being transmitted in the channel region, the carrier mobility of the TFT may be reduced, therefore the leakage current of the TFT in the off-state may be reduced, and the display effect of the display device may be improved.

It will be noted that, the channel region of the TFT refers to a region in the active layer 30 between the source 50 and the drain 60 of the TFT where a conductive channel can be formed under action of an applied voltage.

Figure 5:
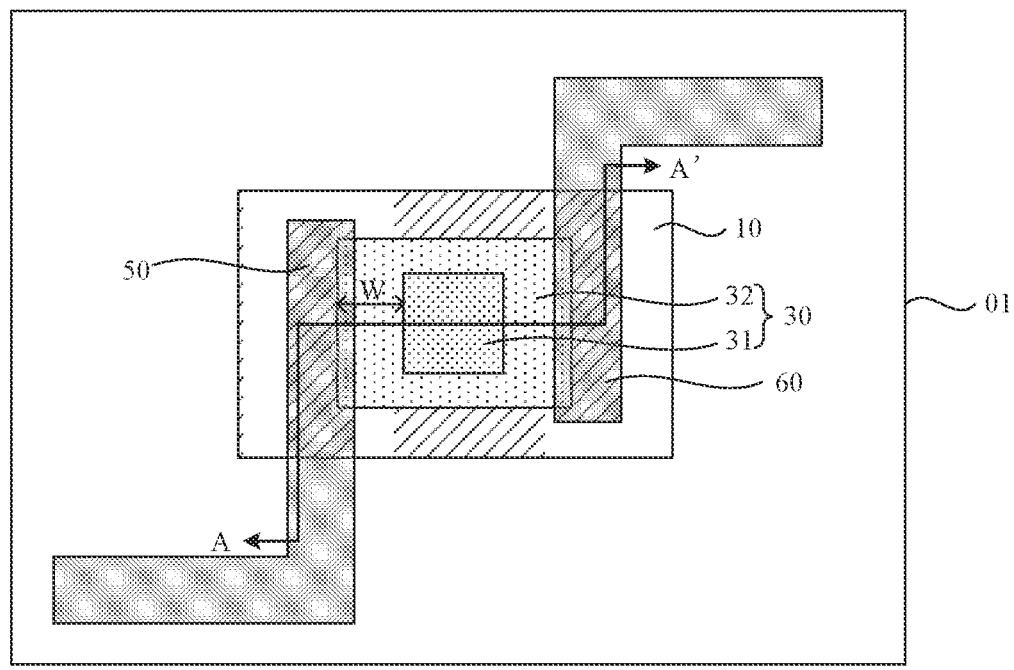
FIG. 5 is a structural diagram of yet another TFT, according to some embodiments of the present disclosure.
Figure 6:
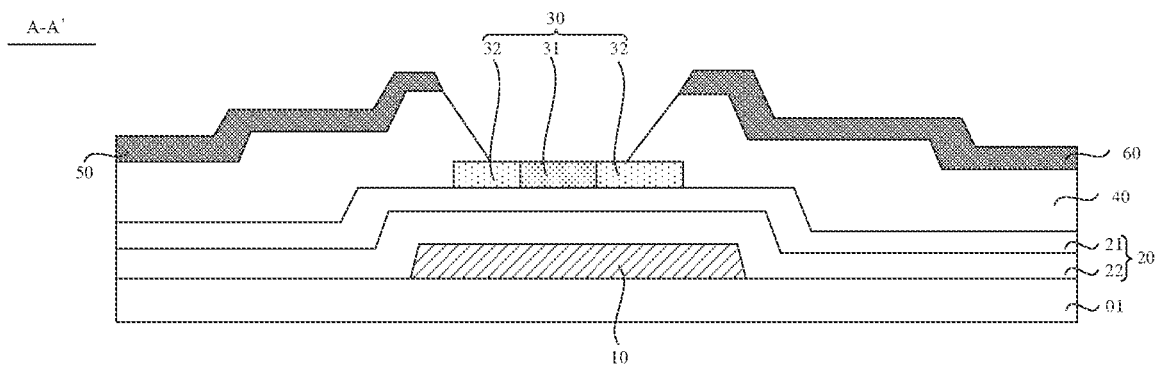
FIG. 6 is a sectional view of the TFT in FIG. 5 taken along line A-A'.

In some embodiments, as shown in FIG. 5, the amorphous silicon pattern 32 surrounds the polysilicon pattern 31 in directions parallel to a plane where the TFT is located. And, as shown in FIG. 6, the source 50 and the drain 60 are coupled to the amorphous silicon pattern 32.

The source 50 and the drain 60 are not coupled to the polysilicon pattern 31.

In this case, during signal transmission between the source 50 and the drain 60, carriers will pass through the amorphous silicon pattern 32, the polysilicon pattern 31 and the amorphous silicon pattern 32 in the active layer 30 in order. In other words, in the channel region of the TFT, the polysilicon pattern 31 and portions of the amorphous silicon pattern 32 located on two opposite sides of the polysilicon pattern 31 are connected in series.

However, as shown in FIG. 1 the channel region of the TFT' only includes the polysilicon patterns 31', and the carriers only pass through the polysilicon pattern 31' when being transmitted in the channel region. Therefore, the carrier mobility of polysilicon material is high, which leads to the high leakage current in the off-state. Compared to the related art, in the TFT provided in the embodiments of the present disclosure, since the carriers pass through the amorphous silicon pattern 32, the polysilicon pattern 31 and the amorphous silicon pattern 32 in order when being transmitted in the channel region, the carrier mobility of the TFT may be reduced, and thus the leakage current of the TFT in the off-state may be reduced.

Figure 7:
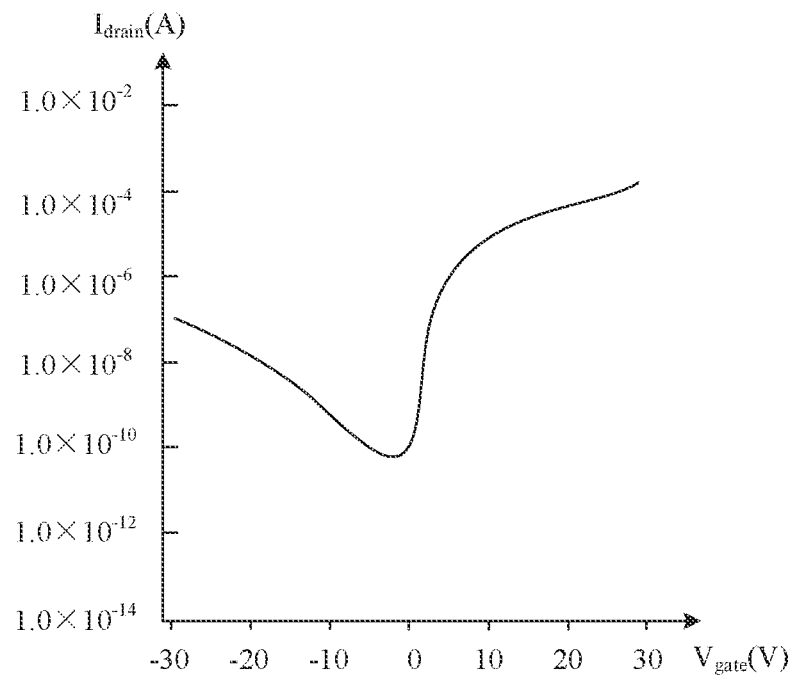
FIG. 7 is a comparison diagram of characteristic transfer curves of TFTs, according to some embodiments of the present disclosure.
Figure 7:
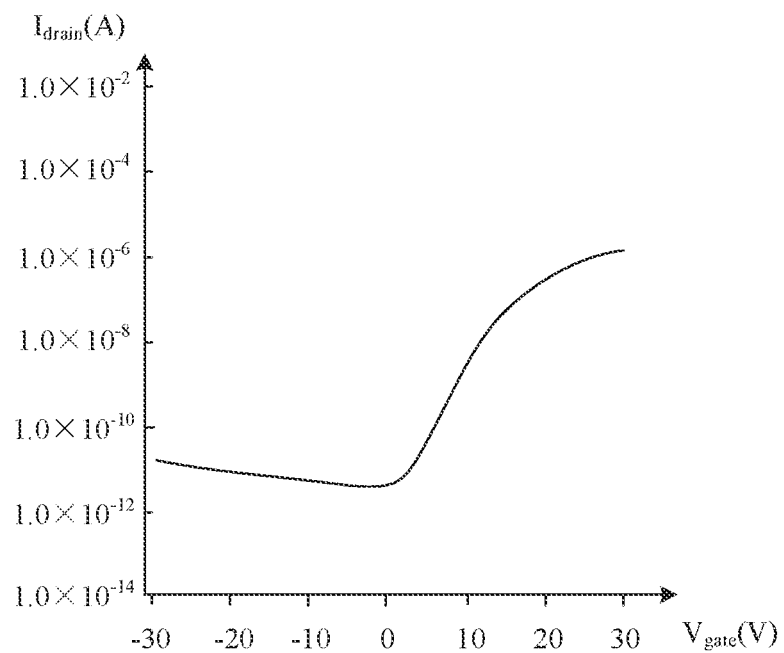

For example, part (a) of FIG. 7 is a characteristic transfer curve of a TFT with a channel region including a polysilicon pattern 31, and part (b) of FIG. 7 is a characteristic transfer curve of a TFT with a channel region including both a polysilicon pattern 31 and an amorphous silicon pattern 32. A horizontal coordinate Vgate represents a gate voltage of a TFT, and a vertical coordinate Idrain represents a drain current of the TFT. It can be seen that, in the off-state, the tail of the curve in part (a) of FIG. 7 goes up, while the curve in part (b) of FIG. 7 relatively tends to flatten and the tail of the curve does not go up. Therefore, the leakage current of a TFT in the off-state having a channel region including a polysilicon pattern 31 and an amorphous silicon pattern 32 is less than the leakage current of a TFT in the off-state having a channel region including only a polysilicon pattern 31.

It will be noted that, a width of the amorphous silicon pattern 32 in the channel region can be set according to actual situations. That is, the width of the amorphous silicon pattern 32 that is connected in series with the polysilicon pattern 31 in the channel region may be set to control the mobility of the TFT.

In some embodiments, widths of portions of the amorphous silicon pattern 32 located on two opposite sides of the polysilicon pattern 31 are equal.

For example, in a case where the amorphous silicon pattern 32 surrounds the polysilicon pattern 31 in the directions parallel to the plane where the TFT is located, distances between various positions on an outer edge of the amorphous silicon pattern 32 and an outer edge of the polysilicon pattern 31 are equal.

In some embodiments, in a direction parallel to the plane where the TFT is located and to a connection line between the source 50 and the drain 60, a width (shown as W in FIG. 5) of a portion of the amorphous silicon pattern on a side of the polysilicon pattern is within a range of 2 µm to 5 µm.

For example, in the direction parallel to the plane where the TFT is located and to the connection line between the source 50 and the drain 60, the width of the portion of the amorphous silicon pattern 32 on the side of the polysilicon pattern 31 is 2.5 µm, 3 µm or 4 µm.

For example, in the case where the amorphous silicon pattern 32 surrounds the polysilicon pattern 31 in the directions parallel to the plane where the TFT is located, a distance between the outer edge of the amorphous silicon pattern 32 and the outer edge of the polysilicon pattern 31 is within a range of 2 μm to 5 μm.

Figure 8:
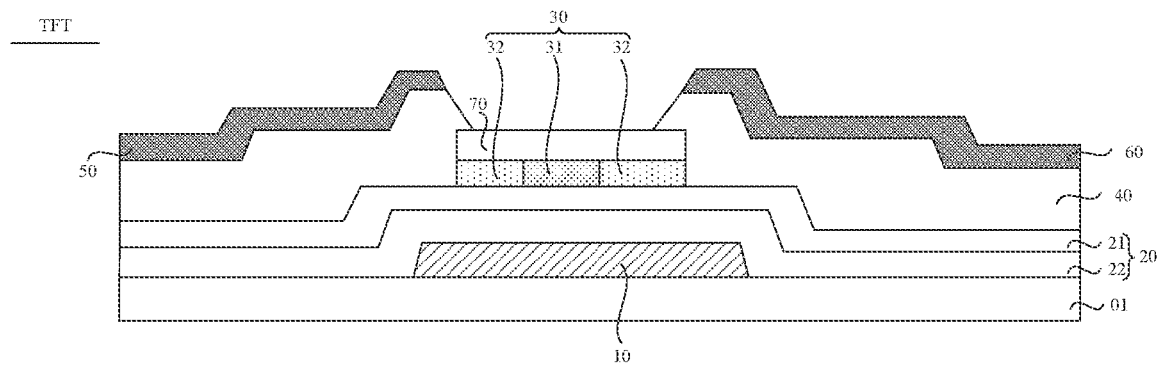
FIG. 8 is a structural diagram of yet another TFT, according to some embodiments of the present disclosure.

In some embodiments, as shown in FIG. 8, the TFT further includes a barrier layer 70 disposed on a side of the active layer 30 away from the gate 10.

An edge of the ionized amorphous silicon layer 40 proximate to the active layer 30 overlaps on a surface of the barrier layer 70 away from the gate 10.

In this case, in terms of process, the barrier 70 has a protective effect on the active layer 30. In this way, it may be possible to prevent the active layer 30 from being affected by, for example, an etching solution used in a process of patterning the source 50 and the drain 60 in subsequent film fabrication processes, and therefore improve a stability of the active layer 30.

In some embodiments, in a case where the active layer 30 includes the polysilicon pattern 31 and the amorphous silicon pattern 32, an orthographic projection of the barrier layer 70 on the plane where the TFT is located covers an orthographic projection of the polysilicon pattern 31 on the plane where the TFT is located, and an edge of the orthographic projection of the barrier layer 70 on the plane where the TFT is located coincides with an edge of an orthographic projection of the active layer 30 on the plane where the TFT is located.

For example, a thickness of the barrier layer 70 is within a range of 1000 Å to 1500 Å. For example, the thickness of the barrier layer 70 is 1100 Å, 1200 Å, or 1300 Å.

Since the polysilicon pattern 31 in the active layer 30 is not exposed, the ionized amorphous silicon layer 40 formed later is not coupled to the polysilicon pattern 31, but is coupled to the amorphous silicon pattern 32. In this case, the source 50 and the drain 60 are coupled to the amorphous silicon pattern 32 through the ionized amorphous silicon layer 40. In this way, during the signal transmission between the source 50 and the drain 60, the carriers pass through the amorphous silicon pattern 32, the polysilicon pattern 31 and the amorphous silicon pattern 32 in order when being transmitted in the channel region, Therefore, the carrier mobility of the TFT may be reduced, and thus the leakage current of the TFT in the off-state may be reduced.

Figure 9:
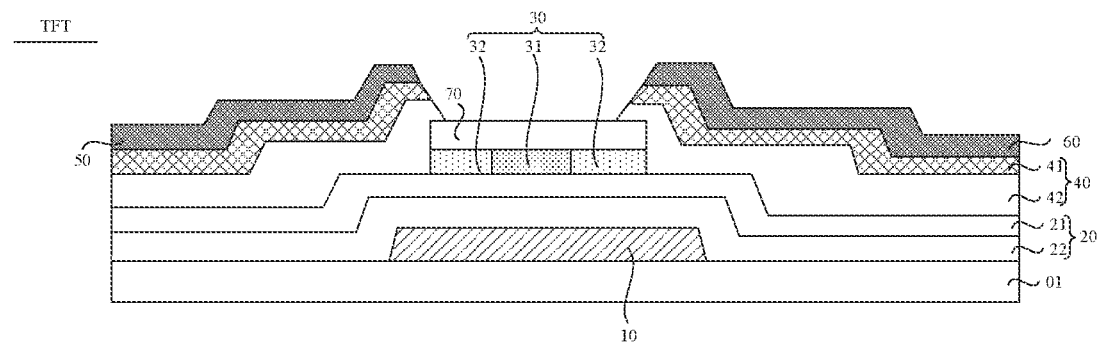
FIG. 9 is a structural diagram of yet another TFT, according to some embodiments of the present disclosure.

In some embodiments, as shown in FIG. 9, the ionized amorphous silicon layer 40 includes an ion doped sub-layer 41 and an amorphous silicon sub-layer 42, The ion-doped sub-layer 41 is farther away from the gate 10 than the amorphous silicon sub-layer 42.

For example, a thickness of the amorphous silicon sub-layer is within a range of 500 Å to 1000 Å. For example, the thickness of the amorphous silicon sub-layer may be 600 Å, 750 Å, 800 Å, or 900 Å. A thickness of the ion-doped sub-layer is within a range of 500 Å to 1000 Å. For example, the thickness of the ion-doped sub-layer may be 650 Å, 700 Å, 800 Å, or 900 Å.

For example, the ion-doped sub-layer 41 adopts N-type heavy doping, and the doped ions in the ion-doped sub-layer 41 are phosphorus ions (P+).

On this basis, in the process of forming the ion-doped sub-layer 41, the amorphous silicon sub-layer 42 may prevent the doped ions from entering the channel region in the active layer 30 during ion doping. The ion-doped sub-layer 41 is in contact with the source 50 and the drain 60, and thus compared with that the source 50 and the drain 60 are in direct contact with the active layer 30, the contact resistance between the active layer 30 and both the source 50 and the drain 60 may be reduced.

In some embodiments, a thickness of the gate 10 is within a range of 2000 Å to 2500 Å, and thicknesses of the source 50 and the drain 60 are within a range of 2500 Å to 3500 Å.

Figure 10:
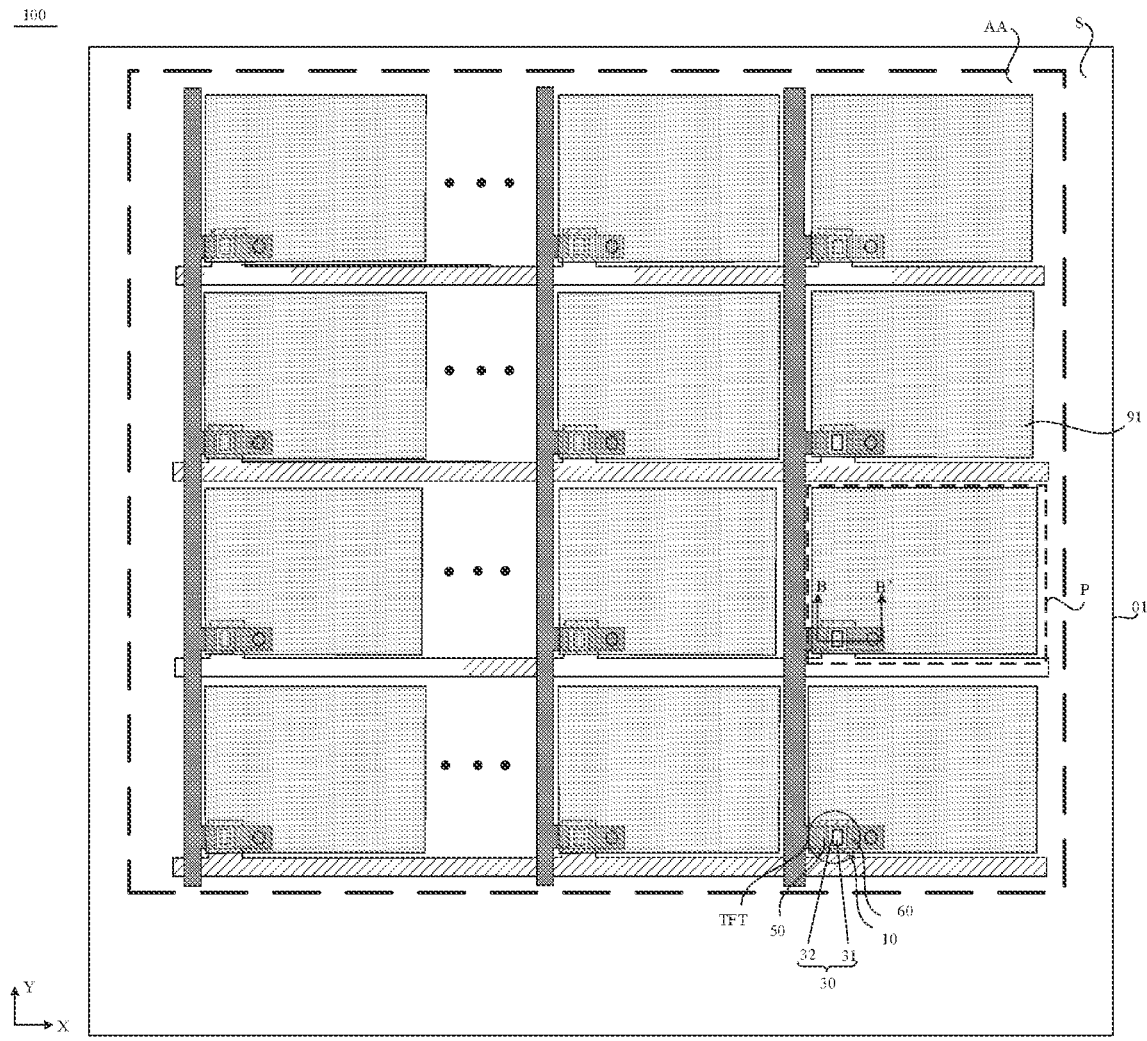
FIG. 10 is a top view of an array substrate, according to some embodiments of the present disclosure.

Embodiments of the present disclosure provide an array substrate 100. As shown in FIG. 10, the array substrate 100 has an active area (AA) and a peripheral area S located on at least one side of the active area AA. The active area AA includes a plurality of sub-pixels P. The plurality of sub-pixels P include at least sub-pixels of a first color, sub-pixels of a second color and sub-pixels of a third color. For example, the first color, the second color, and the third color are red, green, and blue, respectively.

For example, as shown in FIG. 10, the plurality of sub-pixels P are arranged in a matrix. In this case, sub-pixels P arranged in a row along a horizontal direction X are referred to as sub-pixels in a same row, and sub-pixels P arranged in a column along a vertical direction Y are referred to as sub-pixels in a same column.

As shown in FIG. 10, the array substrate 100 includes the TFTs as described in any, one of the above embodiments, and the TFT is arranged in the sub-pixel P.

Figure 11:
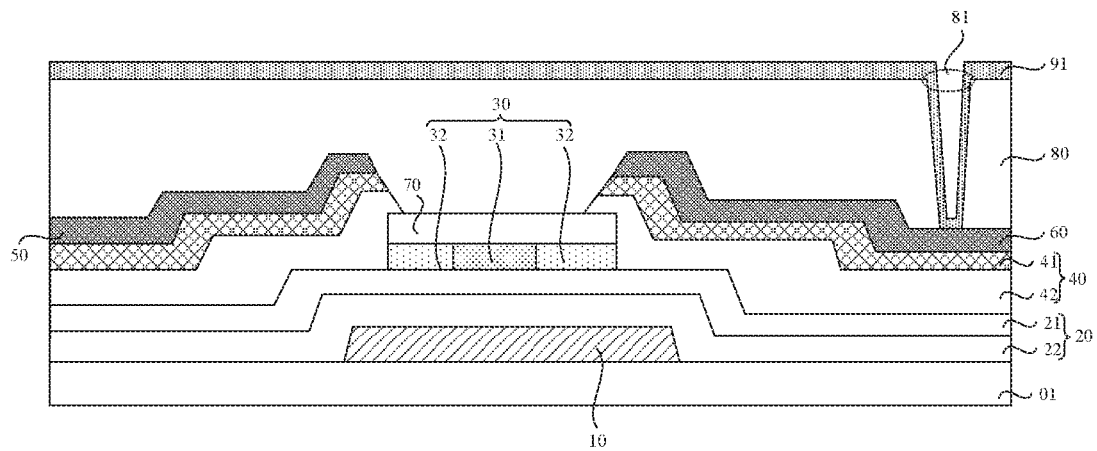
FIG. 11 is a sectional view of the array substrate in FIG. 10 taken along line B-B'.

In some embodiments, as shown in FIGS. 10 and 11, the array substrate 100 further includes a passivation layer 80 and first electrodes 91.

The passivation layer 80 covers the TFTs. The first electrodes 91 are disposed on a side of the passivation layer 80 away from the substrate 01, and the first electrode 91 is coupled to the TFT through a via 81 provided in the passivation layer 80.

For example, the first electrode 91 may be a pixel electrode.

For example, the passivation layer 80 has a two-layer structure. A material of one layer includes silicon dioxide and a material of another layer includes silicon nitride. A material of the first electrode 91 includes indium tin oxide (ITO).

Embodiments of the present disclosure provide a display device 200, which includes the array substrate 100 as described above.

Figure 12:
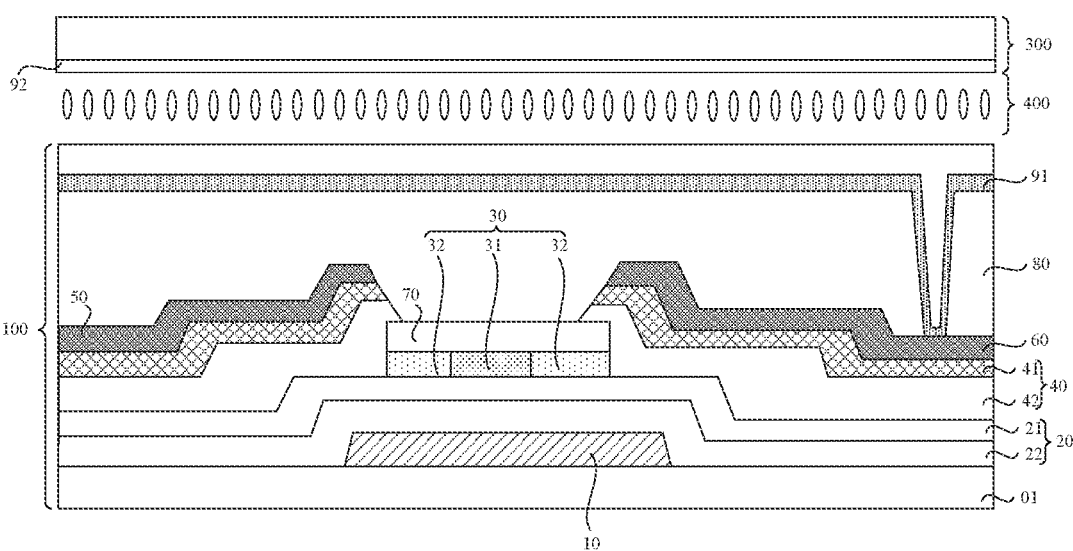
FIG. 12 is a structural diagram of a display device, according to some embodiments of the present disclosure.

In some embodiments, in a case where the display device 200 is a liquid crystal display device, as shown in FIG. 12, the display device 200 further includes a counter substrate 300 and a liquid crystal layer 400. The counter substrate 300 is arranged opposite to the array substrate 100. The liquid crystal layer 400 is located between the array substrate 100 and the counter substrate 300.

In some embodiments, the display device 200 further includes a second electrode 92.

For example, the second electrode 92 is a common electrode.

For example, as shown in FIG. 12, the second electrode 92 is disposed on a surface of the counter substrate 300 proximate to the array substrate 100.

The display device 200 may be any device that can display an image whether in motion (for example, a video) or fixed (for example, a still image), and regardless of text or image. More specifically, it is contemplated that the described embodiments may be implemented in or associated with a variety of electronic devices. The variety of electronic devices may include (but are not limit to), for example, mobile phones, wireless devices, personal digital assistant (PDAs), hand-held or portable computers, global positioning system (GPS) receivers/navigators, cameras, MPEG-4 Part 14 (MP4) video players, video cameras, game consoles, watches, clocks, calculators, TV monitors, flat panel displays, computer monitors, car displays (such as odometer displays), navigators, cockpit controllers and/or displays, camera view displays (such as rear view camera displays in a vehicle), electronic photos, electronic billboards or signages, projectors, building structures, packaging and aesthetic structures (such as a display for an image of a piece of jewelry), etc.

Figure 13:
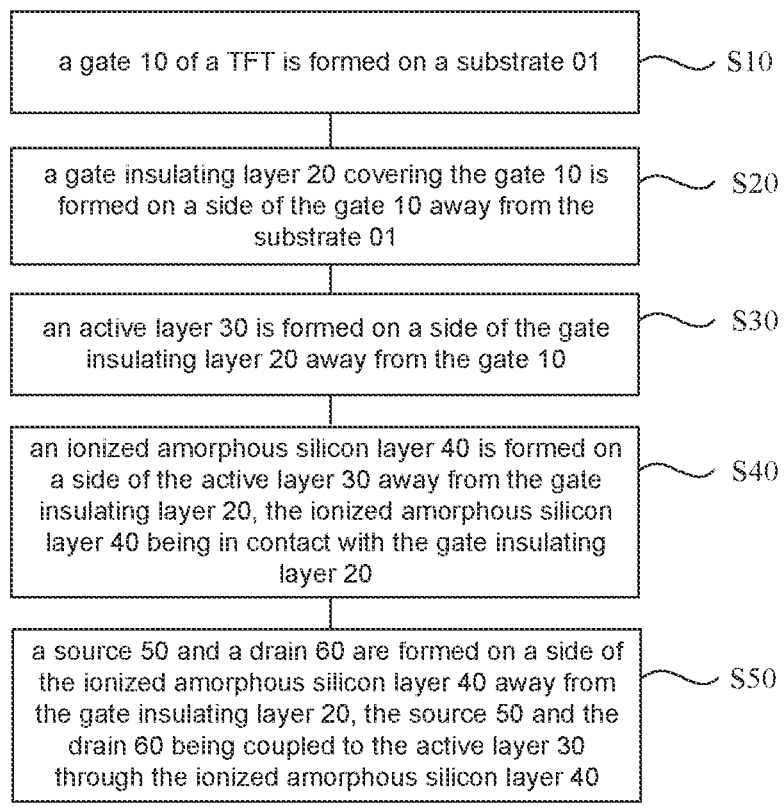
FIG. 13 is a flowchart of a method for manufacturing a TFT, according to some embodiments of the present disclosure.

Embodiments of the present disclosure provide a method for manufacturing a TFT. As shown in FIG. 13, the method includes S10 to S50.

In S10, referring to FIG. 1, a gate 10 of a TFT is formed on a substrate 01.

In S20, referring to FIG. 1, a gate insulating layer 20 covering the gate 10 is formed on a side of the gate 10 away from the substrate 01.

In S30, referring to FIG. 1, an active layer 30 is formed on a side of the gate insulating layer 20 away from the gate 10.

In S40, referring to FIG. 1, an ionized amorphous silicon layer 40 is formed on a side of the active layer 30 away from the gate insulating layer 20, the ionized amorphous silicon layer 40 being in contact with the gate insulating layer 20.

In S50, referring to FIG. 1, a source 50 and a drain 60 are formed on a side of the ionized amorphous silicon layer 40 away from the gate insulating layer 20, the source 50 and the drain 60 being coupled to the active layer 30 through the ionized amorphous silicon layer 40.

When the material for forming the ionized amorphous silicon layer 40 is deposited on the surface of the active layer 30 away from the gate 10, the gas associated with the deposition process may diffuse to the gate insulating layer 20. Since the density of the gate insulating layer 20 is less than the density of the active layer 30, the barrier effect of the gate insulating layer 20 on gas diffusion is less than that of the active layer 30. As a result, the gas diffuses faster in the gate insulating layer 20. Therefore, it may be possible to avoid bubbling in the surface of the ionized amorphous silicon layer 40 proximate to the gate insulating layer 20, and avoid the falling off of films in the TFT in the subsequent fabrication processes.

Furthermore, since the contact resistance is high in the case where the source 50 and the drain 60 are in direct contact with the active layer 30, it may be possible to reduce the contact resistance between the active layer 30 and both the source 50 and the drain 60 by using the ionized amorphous silicon layer 40 to couple the source 50 and the drain 60 to the active layer 30, and thus may improve the signal transmission efficiency between the active layer 30 and both the source 50 and the drain 60.

Therefore, in the method for manufacturing the TFT provided in the embodiments of the present disclosure, the ionized amorphous silicon layer 40 is in contact with the gate insulating layer 20. When the material for forming the ionized amorphous silicon layer 40 is deposited on the surface of the active layer 30 away from the gate 10, the gas associated with the deposition process may diffuse to the gate insulating layer 20. Since the density of the gate insulating layer 20 is less than the density of the active layer 30, the barrier effect of the gate insulating layer 20 on gas diffusion is less than that of the active layer 30. As a result, the gas diffuses faster in the gate insulating layer 20. Therefore, it may be possible to avoid bubbling in the surface of the ionized amorphous silicon layer 40 proximate to the gate insulating layer 20, and avoid the falling off of films in the TFT in the subsequent fabrication processes. In this way, the stability and yield of the TFT may be improved, so that the TFT can be applied to the production of large-size display devices.

Figure 14:
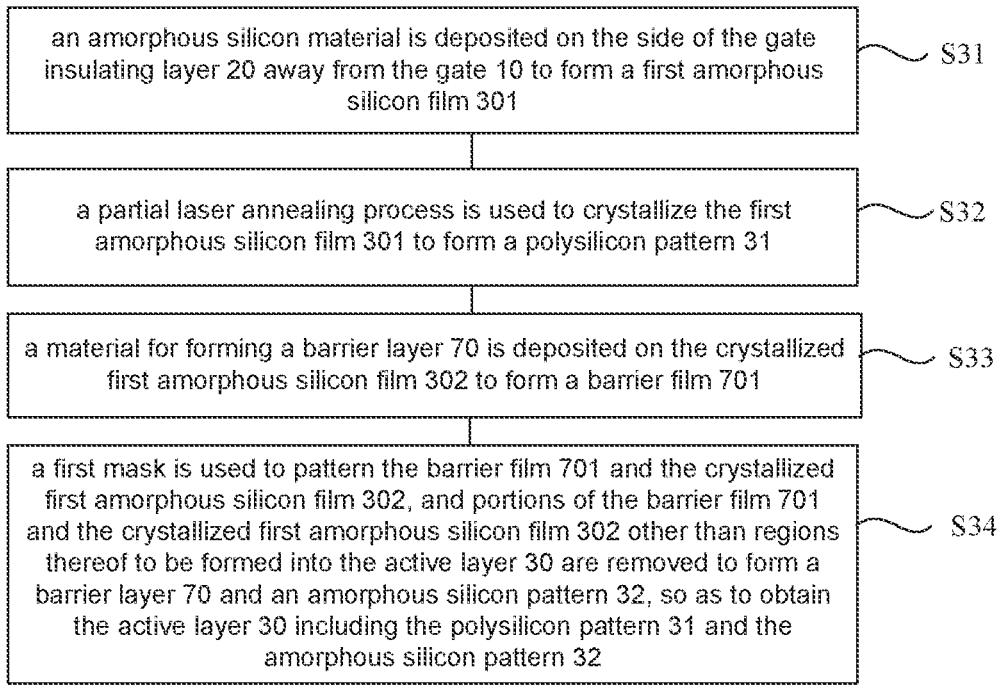
FIG. 14 is another flowchart of a method for manufacturing a TFT, according to some embodiments of the present disclosure.

In some embodiments, as shown in FIG. 14, forming the active layer 30 includes S31 to S34.

Figure 16:
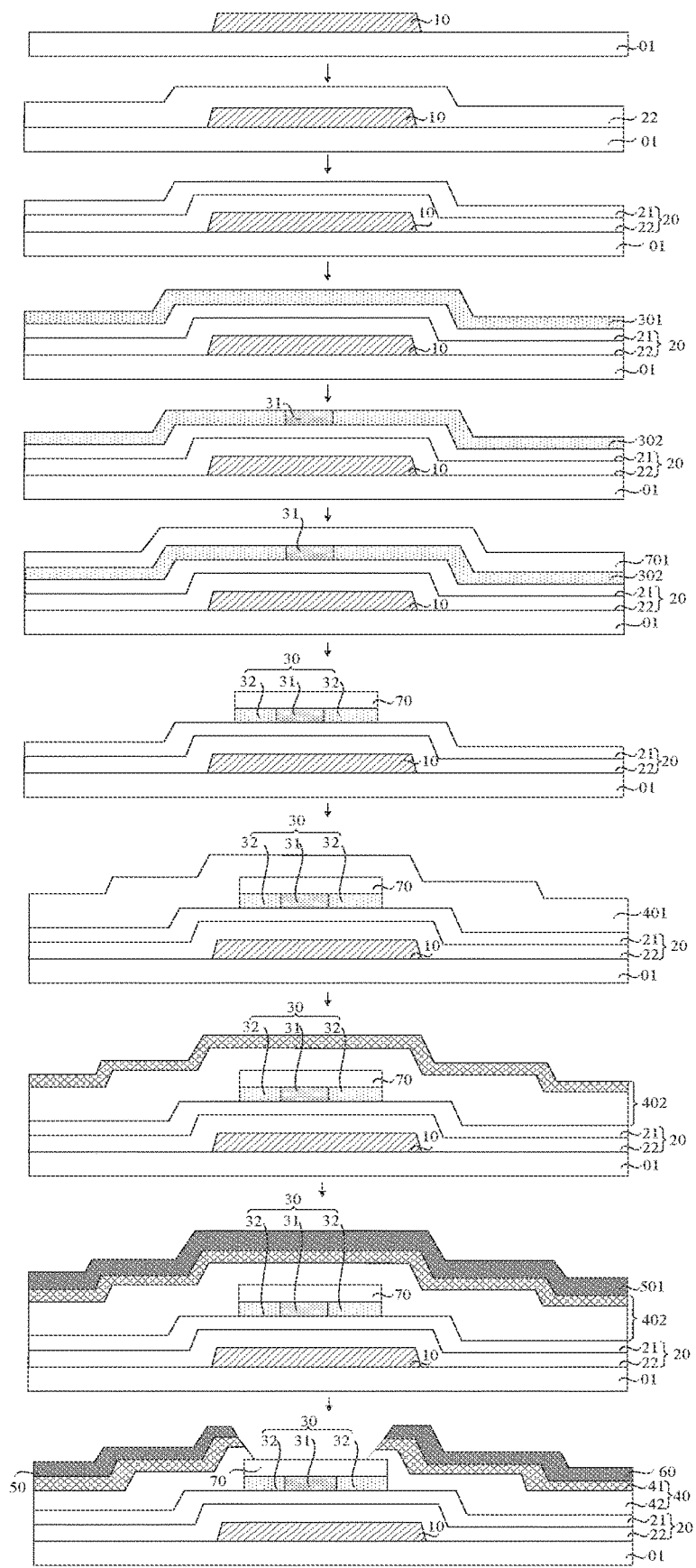
FIG. 16 is a diagram showing a process for manufacturing a TFT, according to some embodiments of the present disclosure.

In S31, as shown in FIG. 16, an amorphous silicon material is deposited on the side of the gate insulating layer 20 away from the gate 10 to form a first amorphous silicon film 301.

For example, a chemical vapor deposition (CVD) process may be used in the deposition process.

In S32, as shown in FIG. 16, a partial laser annealing process is used to crystallize the first amorphous silicon film 301 to form a polysilicon pattern 31.

In this case, the partial laser annealing process can be used to only anneal a partial region (such as the channel region) of the first amorphous silicon film 301, so as to reduce difficulty and cost of the process for fabricating TFTs with high mobility and make it suitable for the production of large-size display devices.

The partial laser annealing process may be a laser annealing process adopting a micro-lens array (MLA).

For example, the mobility of TFT obtained by the partial laser annealing process is approximately 30 $cm^2/(V \cdot s)$.

In S33, as shown in FIG. 16, a material for forming a barrier layer 70 is deposited on the crystallized first amorphous silicon film 302 to form a barrier film 701.

For example, a material of the barrier layer 70 includes silicon dioxide, which is lattice matched to a material of the active layer 30.

In S34, as shown in FIG. 16, a first mask is used to pattern the barrier film 701 and the crystallized first amorphous silicon film 302, and portions of the barrier film 701 and the crystallized first amorphous silicon film 302 other than regions thereof to be formed into the active layer 30 are removed to form a barrier layer 70 and an amorphous silicon pattern 32, so as to obtain the active layer 30 including the polysilicon pattern 31 and the amorphous silicon pattern 32.

It can be understood that the edge of the orthographic projection of the barrier layer 70 on the substrate 01 coincides with the edge of the orthographic projection of the active layer 30 on the substrate 01.

In this case, the barrier 70 has a protective effect on the active layer 30. In this way, it may be possible to prevent the active layer 30 from being affected by, for example, the etching solution used in the process of patterning the source 50 and the drain 60 in the subsequent film fabrication processes, and therefore improve the stability of the active layer 30. Moreover, using the same mask to fabricate the barrier layer 70 and the active layer 30 may also save production costs.

Figure 15:
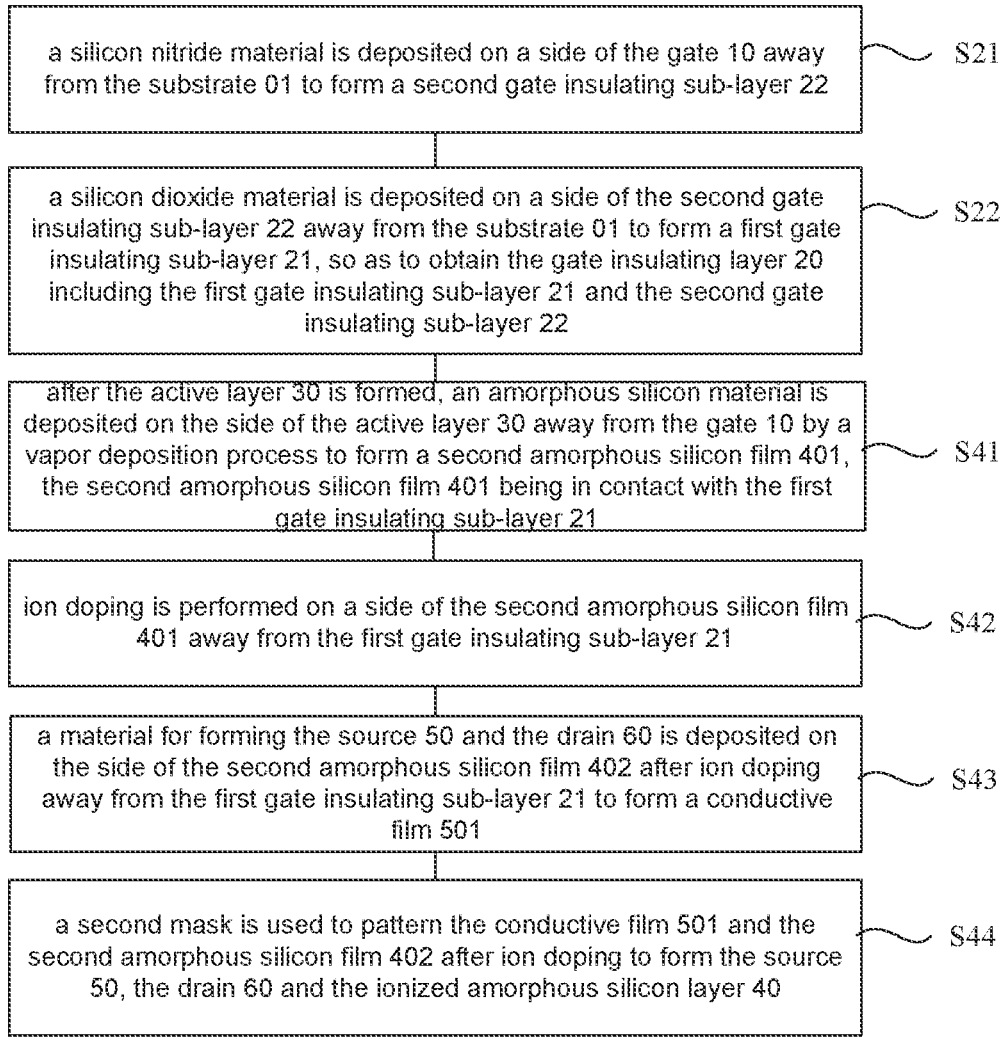
FIG. 15 is yet another flowchart of a method for manufacturing a TFT, according to some embodiments of the present disclosure.

In some embodiments, as shown in FIG. 15, forming the gate insulating layer 20, the ionized amorphous silicon layer 40, the source 50 and the drain 60 includes 321 to 322 and 341 to S44.

In 321, as shown in FIG. 16, a silicon nitride material is deposited on a side of the gate 10 away from the substrate 01 to form a second gate insulating sub-layer 22.

In S22, as shown in FIG. 16, a silicon dioxide material is deposited on a side of the second gate insulating sub-layer 22 away from the substrate 01 to form a first gate insulating sub-layer 21, so as to obtain the gate insulating layer 20 including the first gate insulating sub-layer 21 and the second gate insulating sub-layer 22.

In S41, as shown in FIG. 16, after the active layer 30 is formed, an amorphous silicon material is deposited on the side of the active layer 30 away from the gate 10 by a vapor deposition process to form a second amorphous silicon film 401, the second amorphous silicon film 401 being in contact with the first gate insulating sub-layer 21.

In S42, as shown in FIG. 16, ion doping is performed on a side of the second amorphous silicon film 401 away from the first gate insulating sub-layer 21.

In S43, as shown in FIG. 16, a material for forming the source 50 and the drain 60 is deposited on the side of the second amorphous silicon film 402 after ion doping away from the first gate insulating sub-layer 21 to form a conductive film 501.

In S44, as shown in FIG. 16, a second mask is used to pattern the conductive film 501 and the second amorphous silicon film 402 after ion doping to form the source 50, the drain 60 and the ionized amorphous silicon layer 40.

For example, phosphine (PH3) gas is used to perform ion doping on the second amorphous silicon film 401, so as to obtain the N-type heavily doped ionized amorphous silicon layer 40.

A portion of the second amorphous silicon film 401 that is ion-doped is patterned to form an ion-doped sub-layer 41, and a portion of the second amorphous silicon film 401 that is not ion-doped is patterned to form an amorphous silicon sub-layer 42, so as to obtain the ionized amorphous silicon layer 40 including the ion-doped sub-layer 41 and the amorphous silicon sub-layer 42.

On this basis, using the same mask to form the source electrode 50, the drain electrode 60 and the ionized amorphous silicon layer 40 may save production costs.

The forgoing descriptions are merely specific implementation manners of the present disclosure, but the protection scope of the present disclosure is not limited thereto. Any, person skilled in the art could conceive of changes or replacements within the technical scope of the present disclosure, which shall all be included in the protection scope of the present disclosure. Therefore, the protection scope of the present disclosure shall be subject to the protection scope of the claims.

What is claimed is:

1. A thin film transistor, comprising:
    a gate;
    a gate insulating layer covering the gate;
    an active layer disposed on a side of the gate insulating layer away from the gate, the active layer including a polysilicon pattern and an amorphous silicon pattern disposed on at least one side of the polysilicon pattern;
    an ionized amorphous silicon layer disposed on a side of the active layer away from the gate, the ionized amorphous silicon layer being in contact with the gate insulating layer;
    a source and a drain that are disposed on a side of the ionized amorphous silicon layer away from the gate insulating layer, the source and the drain being coupled to the active layer through the ionized amorphous silicon layer, and at least one of the source and the drain being coupled to the amorphous silicon pattern; and
    a barrier layer disposed on the side of the active layer away from the gate, a material of the barrier layer including silicon dioxide, wherein
    an edge of the ionized amorphous silicon layer proximate to the active layer overlaps on a surface of the barrier layer away from the gate;
    an orthographic projection of the polysilicon pattern on a surface of the gate away from the gate insulating layer is within a range of an orthographic projection of the barrier layer on the surface of the gate away from the gate insulating layer, and an edge of the orthographic projection of the barrier layer on the surface of the gate away from the gate insulating layer coincides with an edge of an orthographic projection of the active layer on the surface of the gate away from the gate insulating layer;
    the ionized amorphous silicon layer includes an ion doped sub-layer and an amorphous silicon sub-layer;
    the ion doped sub-layer is farther away from the gate than the amorphous silicon sub-layer; and
    a thickness of the amorphous silicon sub-layer is within a range of 500 Å to 1000 Å, and a thickness of the ion doped sub-layer is within a range of 500 Å to 1000 Å.

2. The thin film transistor according to claim 1, wherein a density of the gate insulating layer is less than a density of the active layer.

3. The thin film transistor according to claim 1, wherein a material of the gate insulating layer includes silicon oxide.

4. The thin film transistor according to claim 1, wherein the gate insulating layer includes a first gate insulating sub-layer and a second gate insulating sub-layer that are stacked;
    a material of the first gate insulating sub-layer includes silicon dioxide, and a material of the second gate insulating sub-layer includes silicon nitride; and
    the first gate insulating sub-layer is closer to the ionized amorphous silicon layer than the second gate insulating sub-layer.

5. The thin film transistor according to claim 4, wherein a thickness of the first gate insulating sub-layer is within a range of 1000 Å to 2000 Å, and a thickness of the second gate insulating sub-layer is within a range of 2500 Å to 3000 Å.

6. The thin film transistor according to claim 1, wherein the amorphous silicon pattern surrounds the polysilicon pattern in directions parallel to a surface of the gate away from the gate insulating layer, and the source and the drain are coupled to the amorphous silicon pattern.

7. The thin film transistor according to claim 6, wherein widths of portions of the amorphous silicon pattern located on two opposite sides of the polysilicon pattern are equal.

8. The thin film transistor according to claim 6, wherein in a direction parallel to the surface of the gate away from the gate insulating layer and to a connection line between the source and the drain, a width of a portion of the amorphous silicon pattern on a side of the polysilicon pattern is within a range of 2 μm to 5 μm.

9. The thin film transistor according to claim 1, wherein a thickness of the barrier layer is within a range of 1000 Å to 1500 Å.

10. An array substrate, comprising the thin film transistor according to claim 1.

11. A display device, comprising the array substrate according to claim 10.

12. A method for manufacturing a thin film transistor, the method comprising:
    forming a gate of the thin film transistor on a substrate;
    forming a gate insulating layer covering the gate on a side of the gate away from the substrate;
    forming an active layer on a side of the gate insulating layer away from the gate, the active layer including a polysilicon pattern and an amorphous silicon pattern disposed on at least one side of the polysilicon pattern;
    forming an ionized amorphous silicon layer on a side of the active layer away from the gate insulating layer, the ionized amorphous silicon layer being in contact with the gate insulating layer;

forming a source and a drain on a side of the ionized amorphous silicon layer away from the gate insulating layer, the source and the drain being coupled to the active layer through the ionized amorphous silicon layer, and at least one of the source and the drain being coupled to the amorphous silicon pattern; and forming a barrier layer on the side of the active layer away from the gate, a material of the barrier layer including silicon dioxide, wherein an edge of the ionized amorphous silicon layer proximate to the active layer overlaps on a surface of the barrier layer away from the gate;

an orthographic projection of the polysilicon pattern on a surface of the gate away from the gate insulating layer is within a range of an orthographic projection of the barrier layer on the surface of the gate away from the gate insulating layer, and an edge of the orthographic projection of the barrier layer on the surface of the gate away from the gate insulating layer coincides with an edge of an orthographic projection of the active layer on the surface of the gate away from the gate insulating layer;

the ionized amorphous silicon layer includes an ion doped sub-layer and an amorphous silicon sub-layer;

the ion doped sub-layer is farther away from the gate than the amorphous silicon sub-layer; and a thickness of the amorphous silicon sub-layer is within a range of 500 Å to 1000 Å, and a thickness of the ion doped sub-layer is within a range of 500 Å to 1000 Å.

13. The method for manufacturing the thin film transistor according to claim 12, wherein forming the active layer includes:

depositing an amorphous silicon material on the side of the gate insulating layer away from the gate to form a first amorphous silicon film;

using a partial laser annealing process to crystallize the first amorphous silicon film to form the polysilicon pattern;

depositing the material for forming the barrier layer on the crystallized first amorphous silicon film to form a barrier film;

using a first mask to pattern the barrier film and the crystallized first amorphous silicon film; and removing portions of the barrier film and the crystallized first amorphous silicon film other than regions thereof to be formed into the active layer to form the barrier layer and the amorphous silicon pattern, so as to obtain the active layer including the polysilicon pattern and the amorphous silicon pattern.

14. The method for manufacturing the thin film transistor according to claim 12, wherein forming the gate insulating layer, the ionized amorphous silicon layer, the source and the drain includes:

depositing a silicon nitride material on a side of the gate away from the substrate to form a second gate insulating sub-layer;

depositing a silicon dioxide material on a side of the second gate insulating sub-layer away from the substrate to form a first gate insulating sub-layer, so as to obtain the gate insulating layer including the first gate insulating sub-layer and the second gate insulating sub-layer;

after the active layer is formed, depositing an amorphous silicon material on the side of the active layer away from the gate by a vapor deposition process to form a second amorphous silicon film, the second amorphous silicon film being in contact with the first gate insulating sub-layer;

performing ion doping on a side of the second amorphous silicon film away from the first gate insulating sub-layer;

depositing a material for forming the source and the drain on the side of the second amorphous silicon film after ion doping away from the first gate insulating sub-layer to form a conductive film; and using a second mask to pattern the conductive film and the second amorphous silicon film after ion doping to form the source, the drain and the ionized amorphous silicon layer.

* * * * *